United States Patent [19]

Ito

[11] 4,297,782
[45] Nov. 3, 1981

[54] METHOD OF MANUFACTURING SEMICONDUCTOR DEVICES

[75] Inventor: Takashi Ito, Kawasaki, Japan

[73] Assignee: Fujitsu Limited, Kawasaki, Japan

[21] Appl. No.: 109,100

[22] Filed: Jan. 2, 1980

Related U.S. Application Data

[63] Continuation of Ser. No. 851,766, Nov. 15, 1977, abandoned.

[30] Foreign Application Priority Data

Nov. 27, 1976 [JP] Japan ................. 51/142527
Jul. 6, 1977 [JP] Japan ................. 52/80846
Jul. 6, 1977 [JP] Japan ................. 52/80847
Jul. 6, 1977 [JP] Japan ................. 52/80848
Jul. 6, 1977 [JP] Japan ................. 52/80850

[51] Int. Cl.³ .................. H01L 21/425; H01L 21/263
[52] U.S. Cl. ........................... 29/571; 148/1.5; 29/576 B; 29/590
[58] Field of Search .............. 29/571, 576 B, 584, 29/578, 590; 148/1.5

[56] References Cited

U.S. PATENT DOCUMENTS

| | | | |
|---|---|---|---|
| 3,328,210 | 6/1967 | McCaldin | 29/576 B |
| 3,600,797 | 8/1971 | Bower | 29/576 B |
| 3,708,360 | 2/1973 | Wakefield | 29/571 |
| 3,747,203 | 7/1973 | Shannon | 29/578 |
| 3,852,120 | 12/1974 | Johnson et al. | 148/1.5 |

*Primary Examiner*—Donald L. Walton
*Attorney, Agent, or Firm*—Staas & Halsey

[57] ABSTRACT

A method of manufacturing semiconductor devices, comprising the steps of depositing a thin metallic film on an insulative film formed on a semiconductive substrate, and projecting said thin metallic film with ion beams bombarded from above to partially inject the metal atoms of said thin metallic film into said insulative film, thereby changing the inversion threshold voltage of the surface of said semiconductive substrate. By varying the amount of the projection ion beams and the thickness and kind of said thin metallic film, the inversion threshold voltage of said semiconductive substrate can be effectively controlled.

18 Claims, 27 Drawing Figures

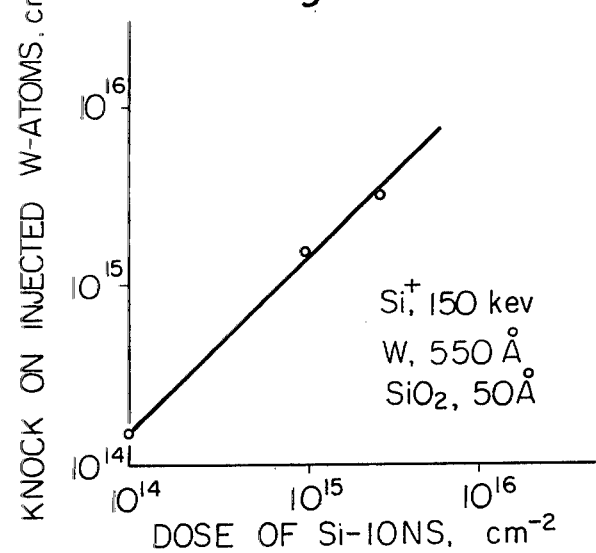
Fig. 2 (a)
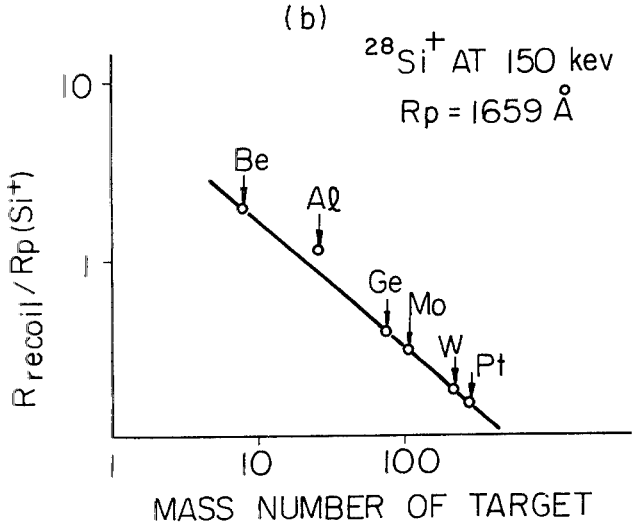
(b)

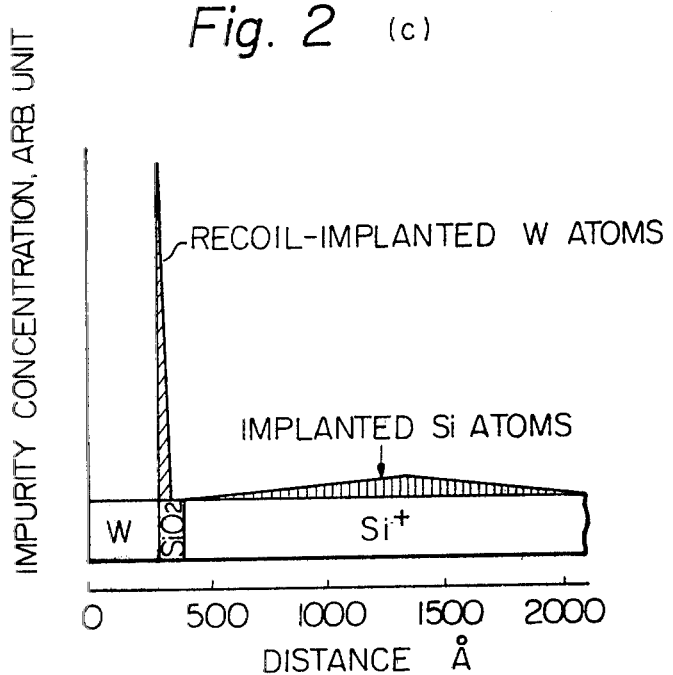
Fig. 2 (c)
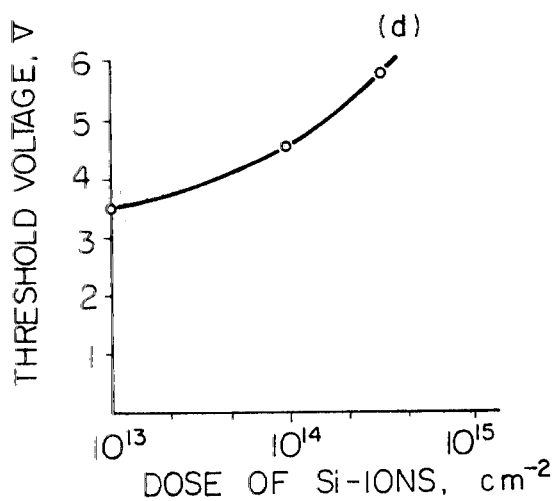
(d)

METHOD OF MANUFACTURING SEMICONDUCTOR DEVICES

This is a continuation of application Ser. No. 851,766 filed Nov. 15, 1977 now abandoned.

BACKGROUND OF THE INVENTION

The present invention relates to a method of manufacturing semiconductor devices.

Field of the Invention

In the art of manufacturing semiconductor devices, it is very essential to appropriately control the characteristics of the interface between a semiconductive substrate and insulative, i.e., insulating film formed thereon, that is the characteristics of an inversion layer. This is a very important problem especially in the manufacture of semiconductor devices such as metal-insulator-semiconductor type field effect transistors (MIS FET) in which the inversion layer is utilized as a conduction channel. When a voltage of a certain magnitude is applied to an electrode disposed on an insulative film, such an inversion layer will be produced or made to disappear on the surface of a semiconductive substrate beneath said electrode. That voltage is called an "inversion threshold voltage". This inversion threshold voltage mainly depends on the impurity concentration of the semiconductive substrate, thickness of the insulative film formed thereon, material of the electrode on said insulative film, and contamination.

Description of the Prior Art

The process of manufacturing semiconductor devices must be controlled to obtain a predetermined level of the inversion threshold voltage for the following reasons. If a surface inversion layer is produced in an area between elements called a "field", the elements may not be electrically isolated completely, resulting in an excessive leakage of current. It is not satisfactory that such an inversion layer is not produced in the field of a semiconductor device only when the semiconductor device is completed. This is because, when such a device is to be actuated, a certain voltage is applied to an electrode or wiring layer present on the insulative film formed on a substrate, and the inversion layer may be formed. If the voltage exceeds the inversion threshold, an inversion layer will be produced on the surface of said semiconductive substrate beneath said electrode or wiring layer. Accordingly, a field inversion threshold voltage as high as possible is desired for any semiconductor device. The field inversion voltage will be referred to simply as "field threshold voltage" hereinbelow. Further, in MIS FET devices, the inversion threshold voltage in the gate (will be referred to as "gate threshold voltage" hereinbelow) is one of the most important element characteristics and should be set to a level which will result in a suitable value under any conditions of circuit design and operation. Furthermore, in the industry of integrated circuits having MIS FETs as principal components (will be referred to as "MIS IC" herein below), the E/D mode MIS IC, including a combination circuit of an enhancement mode MIS FET and a depletion mode MIS FET, or complimentary MIS IC, including a combination circuit of an n-channel MIS FET and a p-channel MIS FET's, are used in practice, in order to improve the switching speed and reduce the power consumption. In these E/D mode MIS IC and complementary MIS IC devices, a plurality of FETs having different gate threshold voltage are formed on a single semiconductor substrate. In manufacturing these types of MIS IC's, a special process is of course necessary to set a plurality of gate threshold voltages.

Many different methods have been proposed to control the inversion threshold voltage. However, no method has yet been proposed whereby an inversion threshold voltage can be precisely set without adversely affecting the characteristics of the semiconductive devices other than the inversion threshold voltage, and without complicating the manufacturing process or reducing the production yield. With the conventional techniques, for example, the inversion threshold voltage has been controlled, firstly, by varying the thickness of the insulative film formed on the surface of a semiconductive substrate; secondly, by varying the material of the gate electrode; thirdly, by varying the material of the gate insulative film, and; fourthly, by controlling the impurity concentration which determines the pattern of conduction on the surface of the semiconductive substrate.

Nevertheless, the above-mentioned first one of the conventional methods does not permit the polarity of inversion threshold voltage to be changed. Further, the range in which the inversion threshold voltage can be controlled by this method is limited practically because of the complicated manufacturing process and relatively low production yield. When this conventional method is applied for control of the MIS FET gate threshold voltage, for example, even the electrical properties of the semiconductor device will be changed; for instance, the gain of an FET is changed as the thickness of the gate insulative film varies. Further, the above-mentioned second and third conventional methods may be utilized only for the manufacture of semiconductor devices using such materials as are stable both physically and chemically, and further, are easy to work. These methods are disadvantageous in that they can not be used to set an inversion threshold voltage as desired. In addition, no precise nor reproducible setting of inversion threshold voltage can be expected by the third conventional method. Accordingly, it is the fourth method that is considered at present to be the most practical and which is commonly adopted. However, this fourth conventional method is also disadvantageous in that during the many heat treatments necessary in any process of manufacturing semiconductor devices, the impurity in the substrate moves due to the diffusion and is apt to adversely affect various electrical properties of the semiconductor device. The impurity concentration cannot be precisely controlled in any common impurity diffusion process. Consequently, in a case where a precise control of inversion threshold voltage is desired, more particularly in controlling the gate threshold voltage, a method of introducing impurity by ion implantation is adopted. However, this ion implantation of the impurity may cause the surface of the semiconductive substrate to be damaged. For a different inversion threshold voltage to be set, it is of course necessary to apply this fourth method by using different parameters. As a result, if this method is adopted for the manufacture of E/D mode MIS ICs or complimentary MIC ICs, the manufacturing process will be rather complicated.

Further, a field shield structure is known in which a conductive or semiconductive layer is buried in the field insulative film in order to prevent the production of an inversion layer in the field. However, this structure uses the shielding action of the conductive layer in order to prevent any inversion layer from being produced by a voltage applied to the wiring layer on the field insulative film. Namely, no inversion threshold voltage may substantially be controlled by this field shield structure. This structure is also disadvantageous in practice that the conductive layer buried in the field insulative film may cause a short circuit between the wiring layers. Further, since the field insulative film becomes thick, the surface thereof becomes so critically irregular that the wiring layers formed on the insulative films may easily be disconnected.

SUMMARY OF THE INVENTION

Accordingly, the present invention has a major object to provide a method of controlling the inversion threshold voltage in a semiconductor device without adversely affecting any electrical properties other than the inversion threshold voltage.

Another object of the present invention is to provide a novel method of precisely setting an inversion threshold voltage.

Still another object of the present invention is to provide a method by which the inversion threshold voltage can be controlled without a reduction in the production yield of semiconductor devices.

Yet another object of the present invention is to provide a method of manufacturing semiconductor devices in which the inversion threshold voltage will not be changed during the heat treatment processes to which they will be subjected.

A further object of the present invention is to provide a method by which a plurality of inversion threshold voltages in one and same semiconductive substrate can be set in a simpler manner than has been used to date.

A still further object of the present invention is to provide a method for enhancing the field threshold voltage in an integrated circuit comprising MIS FETs.

A yet further object of the present invention is to provide a very novel method by which the gate threshold voltages in an integrated circuit comprising MIS FETs can be set at a precise value.

The above-mentioned objects are attained by the methods according to the present invention, which will be further described below. The methods according to the present invention are all based on the discovery that when metal atoms are injected near the surface of the insulative film, the metal atoms will offer a negative fixed charge. That is to say, the insulative film will be charged negatively near the surface thereof, whereby the inversion threshold voltage on the surface of a semiconductive substrate is changed in the positive direction. In this process, the knock-on injection method is adopted to inject the metal atoms into the insulative film near the surface thereof. This is because the metal atoms, the number of which is precisely controlled, can be distributed at positions near the surface of the insulative film, and therefore, the inversion threshold voltage can be precisely controlled and the undesired effect caused by the injection of ions can be avoided. In the present invention, the technical term "the knock-on injection" means the phenomenon that the metal atoms which are positioned on the surface of the substrate are injected into the substrate by being excited by ions which are projected onto the metal atoms. Use of the term "metals" herein is in a broad sense, and includes the metals, semi-metals or semiconductors listed below.

The above-mentioned knock-on injection is effected as follows. A thin metallic film is deposited on an insulative film, e.g., an $SiO_2$ film, formed on a semiconductive substrate. By projecting said thin metallic film with ion beams bombarded from above. Some of the metal atoms constituting the thin metallic film are injected into the insulative film near the surface thereof. After the metal atoms are injected into the insulative film, the thin metallic film is preferably removed.

Metals which can give negative fixed charges to an insulative film after the metal atoms are injected into the insulative film are: Beryllium Be, Alminum Al, Chromium Cr, Cobalt Co, Copper Cu, Germanium Ge, Gold Au Indium In, Iridium Ir, Iron Fe, Lead Pb, manganese Mn, Molybdenum Mo, Nickel Ni, Palladium Pd, Platinum Pt, Rhodium Rh, Silicon Si, Silver Ag, Tantalum Ta, Thallium Tl, Titanium Ti, Tungsten W, Vanadium V, Zirconium Zr, etc. These metals can form a film having a thickness smaller than 2000 Å in the process according to the invention. Preferably, the thickness of the film formed by these metals is smaller than 1000 Å for the purpose of reducing the energy for the projection or bombarding ions. The energy for projection ions is limited in practice to about 1000 keV(1 MeV). However, the knock on injection can not be carried out with projection or injection energy smaller than 10 keV. When the ions are projected with an energy smaller than 10 keV, a spattering phenomenon occures whereby only the metal film is etched and the knock-on injection is not carried out. It has been confirmed that almost all metal atoms injected by the knock on injection are distributed in a shallow region having a depth of about 100 Å from the surface of the insulative film, and; that the number of metal atoms injected by the knock on injection has a correlation relationship to the amount of the projected ions. As it has been confirmed that the number of projected ions can be precisely controlled by detecting an ion beam current, the number of metal atoms injected by the knock on injection can be also precisely controlled. According to the present invention, the dose of the projected ions is above $10^{10}$ cm$^{-2}$. With such a dose of the projected ions the inversion threshold voltage can be controlled. However, an excess projection of the ions should be avoided, because the surface or the inside of the insulative film into which the metal atoms are injected by the knock on injection becomes conductive and the wiring layers formed on the insulative film may easily be short circuited. Therefore, it is preferable that the dose amount of the projection ions be limited to less than $10^{16}$ cm$^2$. Any ions can be used as the projection ions, however, it is preferable that the ions have no effect upon the various electrical characteristics of the semiconductor device when the ions are injected into the insulative film or into the semiconductive substrate. From this point of view, it is preferable that inert gas ions or ions of a material constituting the substrate, such as silicon Si, are used as the projection ions. As the insulative film used in the present application, a film of silicon dioxide $SiO_2$, silicon nitride $Si_3N_4$, Alumina $Al_2O_3$, or any other insulator can be used.

The metal atoms injected by the knock on injection as mentioned above are distributed in a shallow region below the surface of the insulative film, and these metal atoms are distributed in a mutually insulated state and have negative fixed charges. By the negative fixed charge, the inversion threshold voltage on the semiconductor surface under the insulative film is shifted toward the positive direction as compared with the voltage before the knock on injection is carried out. The amount of shift of the inversion threshold voltage is controlled by the number of metal atoms injected by the knock on injection, and by the distance between the region where the metal atoms are distributed and the semiconductor surface. Therefore, the inversion threshold voltage can be precisely adjusted by controlling the amount of projection ions.

Because the insulative film including the metal atoms injected therein by the knock on injection has no conductive property, the short circuit phenomenon is not caused between the wiring layers formed on the insulative film when the metal film is removed by an etching process. The metal atoms injected into the insulative film have a small diffusion coefficient and, therefore, these metal atoms do not diffuse in the heat process which is carried out later. This means that unexpected variation of the inversion threshold voltage is not caused. It should be noted that, when the projection ions may reach the base plate of the semiconductor device, ions which have no influence upon the electrical characteristics of the semiconductor device may be selected.

It has been confirmed that, in the knock on injection, the amount or the depth of the metal atoms to be injected by the knock on injection can be controlled by changing the kind or the thickness of the metal film formed on the insulative film. By making use of this phenomenon, a plurality of the inversion threshold voltages can be set by only one process of projecting the ion beam. In carrying out this process, metal films having different thicknesses or kinds are formed respectively on different regions on the insulative film formed on the semiconductive substrate and the ion beam is projected on these metal films.

When the process of controlling the inversion threshold voltage by the knock on injection is carried out according to the present invention, the knock on injection process can be carried out in any step of the process for manufacturing the semiconductor device after the insulative film is formed on the semiconductor base plate. Another insulative layer may be formed on the insulative film wherein the metal atoms are injected by the knock on injection.

The knock on injection process according to the present invention can be used for the purpose of increasing the field threshold voltage of a semi-conductor device with a field insulative film on which no element is formed. Especially, when the conductivity type on the surface of the semiconductor substrate is p type, by using the knock on process according to the present invention, the field threshold voltage can be effectively increased.

The knock on injection process according to the present invention can be used for the purpose of adjusting the gate threshold voltage of a MIS FET at a gate insulative film of a semiconductor device. By using this process, the gate threshold voltage of the gate insulative film can be set precisely without having any influence upon the various electrical characteristic of the MIS FET.

The knock on injection process according to the present invention can be used in a device having a plurality of gate threshold voltages, typically such as the E/D mode MIS IC or the complementary MIS IC, to adjust the plurality of gate threshold voltages by one process of projecting the ion beam. In this case, the ion beam is projected after the metal films of different kinds or different thicknesses are formed on the plurality of the gate insulative films. This process can also be used when the field threshold voltage and the gate threshold voltage of the MIS FET are adjusted at the same time.

Further features and advantages of the present invention will be apparent from the ensuing description made with reference to the accompanying drawings to which, however, the scope of the invention is in no way limited.

BRIEF DESCRIPTION OF THE DRAWINGS

FIGS. 2 (a) through (d) illustrate graphically various aspects of knock-on ion injection effected in the manufacture of semiconductor devices according to the present invention;

DETAILED EXPLANATION OF PREFERRED EMBODIMENTS

Figure 1:
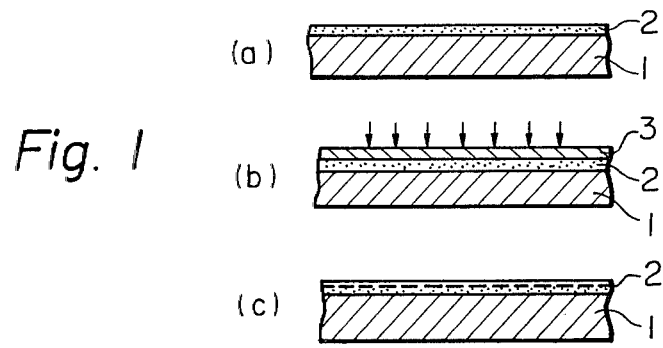
FIGS. 1 (a) through (c) show the principle of the semiconductor device manufacturing method according to the present invention.

Referring to FIG. 1, the knock-on ion injection process essential in the method of manufacturing semiconductor devices according to the present invention will now be described. In FIG. 1 (a), there is shown a p-type silicon substrate 1 on which an insulative film 2 is formed. This insulative film 2 is made of silicon dioxide ($SiO_2$), for example. Further, on the insulative film $SiO_2$ is deposited a thin metallic film 3, for example, a thin tungsten (W) film 3 upon which ion beams are projected. As such ions to be projected, ions of the same material as that of the substrate or inert gas ions are used. This process is illustrated in FIG. 1 (b). In this process, some of the metal atoms of the thin metallic film are injected into the insulative film near the surface thereof. After the metal atoms are injected into the insulative film, by knock on injection, the thin metallic film 3 is removed by etching. This state is shown in FIG. 1 (c). In the above explanation, the case in which a p-type silicon substrate is used has been described, however, this method can of course be applied to an n-type silicon substrate.

FIG. 2 (a) shows the curve of silicon cation dose vs number of recoil-implanted atoms that is knock-on injected atoms in the case where, in the process of recoil implantation (knock-on) injection as shown in FIG. 1, the substrate 1 is made of silicon Si, the insulative film 2 is of silicon dioxide $SiO_2$, the thin metallic film 3 is of tungsten W and the ions to be projected are silicon Si cations. Referring to FIG. 2 (a), the energy for projecting ions is 150 keV and the thickness of the tungsten is 500 Å. As seen in FIG. 2 (a), the number of knock-on injected atoms is nearly the same as that of the implanted silicon cations and these numbers are in a nearly proportional relationship. FIG 2 (b) illustrates the injected depth of metal atoms when the metal atoms are injected with a maximum energy which results when one silicon ion collides squarely with one metal atom. The injected depths for various metals are shown here. The mass number of the metal is shown along the abscissa, while the ratio Rrecoil to Rp along the ordinate shows the injected depth of a metal atom divided by the injection depth of a silicon ion when it does not collide with any metal atoms. As seen in FIG. 2 (b), when aluminum Al is used, the injected depth of a silicon ion is nearly equal to that of the aluminum ion, while the ions of heavier metals for example, tungsten W or platinum Pt, are not injected so deep. In the actual process, the metal atoms can be injected into only a very shallow region of the insulative film, because the probability of supplying maximum energy to the metal atoms is extremely small and multi-collisions are produced between the metal atoms and projection ions. FIG. 2 (c) shows the practical distributions of tungsten ions and injected ions vs the depths of insulative film and silicon substrate when the silicon ions collide with metal ions under the conditions that the substrate 1 is made of silicon Si, the insulative film 2 is of silicon dioxide $SiO_2$, the thin metallic film 3 is of tungsten W and the ions to be projected are silicon cations. As will be apparent from FIG. 2(c), 99% or more the knock on injected tungsten W atoms are present within the region having a depth of 50 Å from the surface when the knock-on injection is effected under the conditions that the projection ion energy is 150 keV, the thickness of the tungsten W film is 500 Å and the dose of silicon cations is $1 \times 10^{15}$ cm$^{-2}$. In FIG. 2 (d), the relation of the silicon Si cation dose to the inversion threshold voltage according to one embodiment of the present invention is illustrated. As shown in this figure, the inversion threshold voltage increases with the dose of silicon cations. This is due to the fact that the tungsten W atoms recoil-implanted into the insulative film near the surface thereof act as negative fixed charges in the insulative film.

Figure 3:
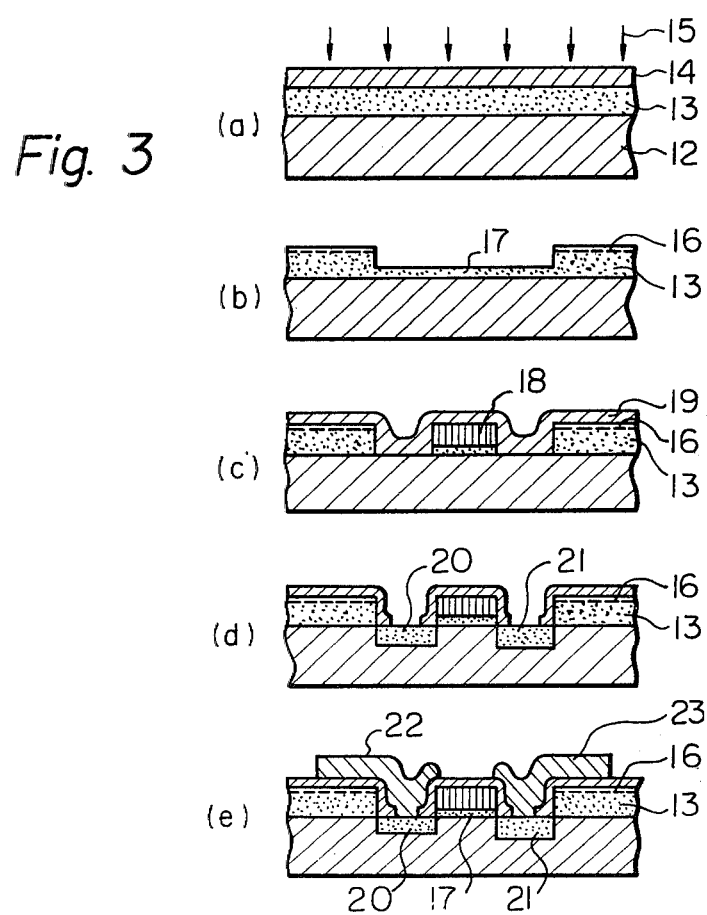
FIGS. 3 (a) through (e) show the manufacturing processes in the first embodied method of manufacturing semiconductor devices according to the present invention.

The method embodied according to the present invention for MIS FET's in order to enhance the field threshold voltage will now be described with reference to FIGS. 3 (a) through (e). According to this method, as illustrated in FIG. 3 (a), deposited on a p type silicon substrate 12 is a field insulative film 13 and, then, a tungsten W metal layer 14 with a thickness of 500 Å is deposited on the insulative film. After silicon ion Si+ beams 15 are projected onto the tungsten W metal layer 14, in a dose of $10^{15}$ cm$-2$ and at a projection energy of 150 keV, the top metal layer 14 is removed by chemical etching. Then, the silicon dioxide $SiO_2$ film 13 is removed from the element region by means of chemical etching. After that, a gate oxide film 17 is produced on the channel region by thermal oxidation as illustrated in FIG. 3 (b). In these figures, the reference numeral 16 denotes a layer containing knock on injected tungsten W atoms. If any metal layer 14 is not removed the surface of the field insulative film 13 becomes conductive so that the electrodes or wiring layers of a semiconductor device may easily be short-circuited. To avoid this, the metal layer 14 must be completely removed by chemical etching means. The field insulative film 13, namely, the $SiO_2$ film, is generaly 5000 Å or more thick. In the present invention, the thinner the $SiO_2$ film 13 is, the more effectively the field threshold voltage is improved. The thickness of the $SiO_2$ film 13 should be chosen in the range larger than the knock-on injection range of the metal atoms so that the metal atoms do not reach the interface between the $SiO_2$ film and the semiconductor substrate, and do not exert a bad influence upon the characteristics of semiconductor device. When the thickness of the $SiO_2$ insulative film 13 is 5000 Å under the above-mentioned knock-on injection conditions, the threshold at which an inversion layer is produced in the field region is improved by about 20 V.

Next, a gate electrode 18 of polycrystalline silicon is formed as shown in FIG. 3 (c). After removing the insulative film 17 other than the portion below the gate electrode 18, a phosphosilicate glass layer 19 is deposited on the entire surface. The phosphorus is diffused from the phosphosilicate glass layer 19 by heat treatment to produce n+ diffused layers of drain and source, while reducing the electric resistance of the Si gate electrode 18. During the processes mentioned above, the knock on injected metal atoms present in the layer 16 at the surface of the $SiO_2$ insulative film 13 are not influenced because they are isolated by the $SiO_2$ molecules. In the subsequent process, an opening for an electrode is formed in the phosphosilicate layer 19 on the source and drain diffused regions 20, 21 as shown in FIG. 3 (d). Then, an electrode wiring metal is evaporated and patterned to form source and drain electrodes 22, 23, which are extended on the field insulative film and thus, a MIS FET is completed.

Figure 4:
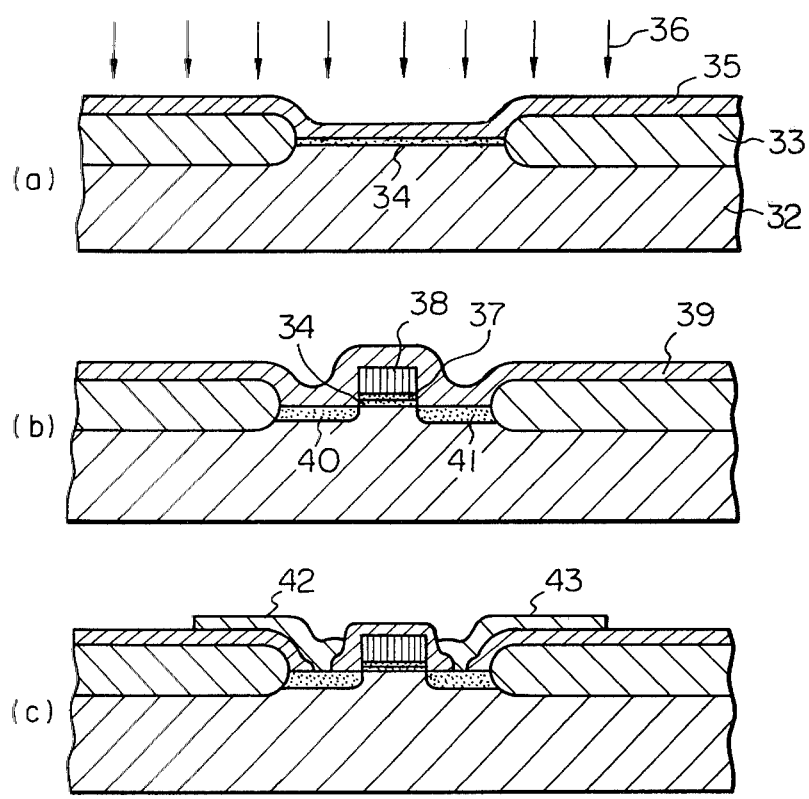
FIGS. 4 (a) through (c) show the manufacturing processes in the second embodied method of manufacturing semiconductor devices according to the present invention.

In the following description, the method embodied according to the present invention in order to adjust the gate threshold voltage for a MIS FET will be described with reference to FIGS. 4 (a) through (c). In FIG. 4 (a), the reference numeral 32 denotes a p-type silicon substrate; 33, a field insulative ($SiO_2$) film of about 8000 Å, and; 34 represents a gate insulative ($SiO_2$) film of 100 Å. The reference numeral 35 denotes a thin tungsten (W) film which is evaporated to about 500 Å by the electron beam evaporation process. The reference numeral 36 represents silicon ion beams, the projection energy of which is 150 keV. By projecting the thin tungsten film 35 with the silicon ion beams 36, a part of the tungsten atoms are knock on injected into the gate insulative $SiO_2$ film 34 near the surface thereof. After removing the thin tungsten film, a silicon nitride $Si_4N_4$ film 37 having a thickness of 700 Å is formed on the $SiO_2$ film 34. Both of the $SiO_2$ film 34 and the $Si_3N_4$ film 37 constitute a gate insulating film which is generally 100-2000 Å thick. After, forming a polycrystalline silicon gate electrode 38, the $Si_3N_4$ film 37 and a $SiO_2$ film 34 are etched by using a polycrystalline silicon gate 38 as a mask, and n+ regions of source and drain 40, 41 are formed by a diffusion of phosphorus from the phosphosilicate glass layer 39 formed thereon by a chemical vapor deposition process, for example, as illustrated in FIG. 4 (b). Then the source and drain electrodes 42, 43 are formed to complete a semiconductor device as shown in FIG. 4 (c).

The gate threshold voltage of the MIS FET shown in FIG. 4 (c) can be changed by changing the amount of the dose of the silicon ion beam, and the relation between the amount of the dose and the gate threshold voltage is as shown in FIG. 2 (d). This MIS FET includes the silicon nitride $Si_3N_4$ film 37 having positive charges as the gate insulative film and, therefore, originally this MIS FET has a negative gate threshold voltage. However, by using the knock on ion injection process according to the present invention, a positive gate threshold voltage, such as +3.7 volts, can be obtained when the amount of the dose is, for example, $10^{14}$ cm$^{-2}$.

The method embodied according to the present invention for manufacture of MIS IC comprising a plurality of MIS FETs provided on one semiconductive substrate with gate insulative films of different inversion thresholds will be described with reference to FIGS. 5 and 6.

Figure 5:
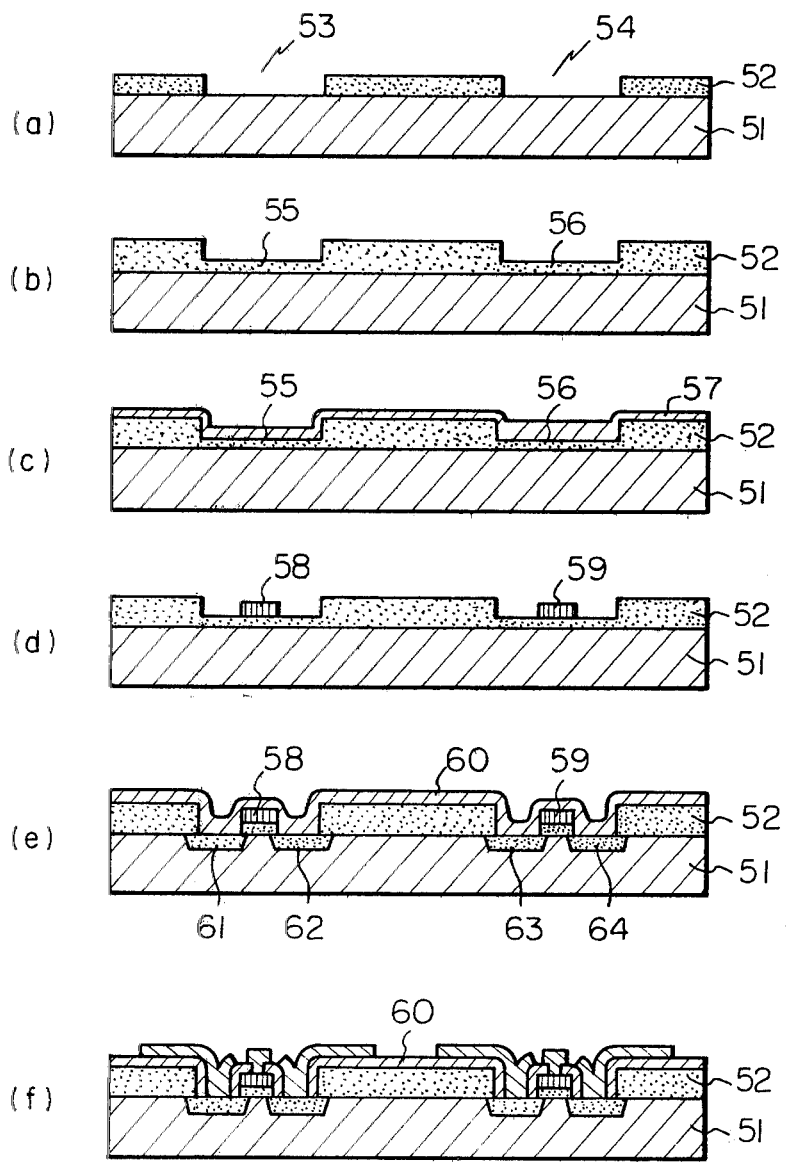
FIGS. 5 (a) through (f) and 6 (a) through (f) illustrate the third and fourth embodied methods of manufacturing semiconductive devices according to the present invention.

FIG. 5 illustrates an embodiment of the method according to the present invention, in which the gate threshold voltage is controlled by varying the thickness of the thin metallic film. First, as shown in FIG. 5 (a), formed on a p-type silicon substrate 51 is a silicon dioxide film 52 of about 1µ in thickness, which is removed selectively to form regions 53, 54 for production of MIS FETs. Then, the thermal oxidation method is adopted to form on the regions 53 and 54, on the substrate surface, silicon dioxide films 55, 56 of about 500 Å which will be gate insulative films, as shown in FIG. 5 (b). As shown in FIG. 5 (c), at least the regions 53, 54 are covered by a film 57 of a metal, e.g., tungsten W. At this time, the region 53 (gate insulative film 55) is covered by the tungsten film to a thickness of 200 Å, while the region 54 (gate insulative films 56) is covered to a thickness of 500 A. Next, at least the region covered by the tungsten film 57 is projected with silicon ion beams, under the conditions of 150 keV in acceleration energy and of $1 \times 10^{15}$ cm$^{-2}$ in dose, to knock on inject a portion of the tungsten atoms into the gate insulative films near the surfaces thereof. Then, all the tungsten film covering the surfaces of the gate insulative films is removed and subject to a heat treatment at 1000° C., for some 30 minutes, to eliminate any distortion in the gate insulative films and silicon substrate. Then, as shown in FIG. 5 (d), on the gate insulative films 55 and 56 are selectively formed polycrystalline silicon layers 58 and 59, which become gate electrodes. It should be noted that the heat treatment may be effected with the film surfaces covered with silicon nitride Si$_3$N$_4$ films. After the gate insulative films 55 and 56 are selectively removed by etching means as masked by said polycrystalline silicon layers 58 and 59, the entire surface is covered by a phosphosilicate glass layer 60 by chemical vapor deposition method. Then, the substrate is further subjected to a heat treatment at 1000° C. for about 30 minutes to form n+ type regions 61, 62, 63 and 64, as shown in FIG. 5 (e), these regions becoming the source and drain. At this time, phosphorus is diffused also into the polycrystalline silicon layers 58 and 59 to impart a conductivity to said polycrystalline silicon layers. Thereafter, openings for electrodes are selectively formed in the phosphosilicate glass layers 60 on the n+ type regions and gate electrodes, and there is deposited aluminum Al, for example, which is selectively removed to form a gate lead-out electrode and source and drain electrodes as shown in FIG. 5 (f).

The MIS FET thus formed in the region 53 of the silicon substrate has a threshold voltage of 5 V, while the MIS FET in the region 54 has a threshold voltage of about 1 V.

Figure 6:
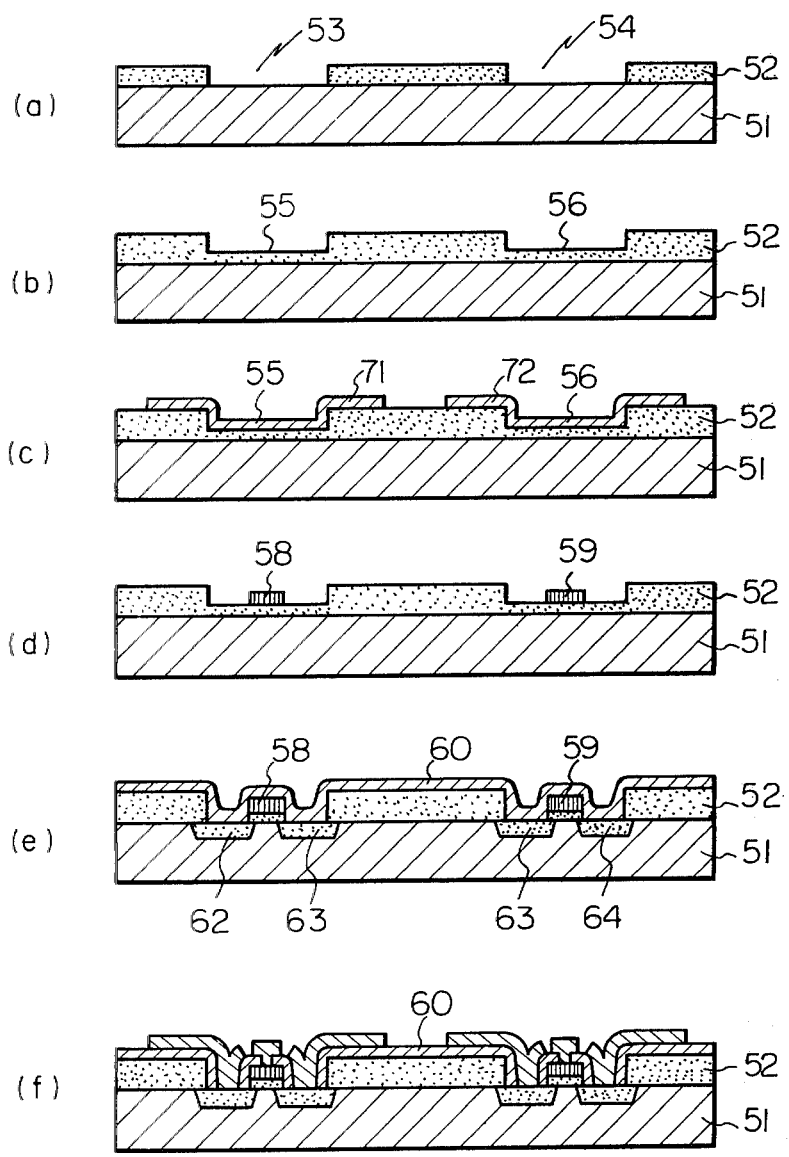

FIGS. 6 (a) through (f) illustrate an embodiment of the method according to the present invention for controlling the gate threshold voltage by varying the kind of thin metallic film material. The embodiment in FIG. 6 (a) through (f) is a variation of that shown in FIGS. 5, (a) through (f) and is identical to the latter except for the process in FIGS. 6 (c). Namely, according to this embodiment in FIG. 6 (a) through (f), especially in the process in FIG. 6 (c), the region 55 is covered by a metallic film 71, made of, for example, tungsten W, to a thickness of 500 Å. The region 56 is covered by a molybdenum Mo film 72 to a thickness of 500 Å. After that, these regions are further subjected to the subsequent processes, including the process of projecting the silicon Si cation beam, which is the same process as shown in (d) through (f) of FIGS. 5 (a) through (f). By the method of FIGS. 6 (a) through (f), an MIS FET formed in the region 63 of the silicon substrate has a threshold voltage of about 4 V, while the MIS FET formed in the region 64 has a threshold voltage of about 2 V.

What is claimed is:

1. A method of adjusting at least one inversion threshold voltage at the surface of a semiconducting portion of a semiconductor device during the manufacture of said device, said adjusting method comprising
   forming a first insulative film on said surface of said semiconducting portion,
   forming a thin metallic film on said first insulative film,
   bombarding said thin metallic film with an ion beam to partially inject said thin metallic film into said first insulative film to produce negative fixed charges in said first insulative film,
   removing said thin metallic film, and
   forming a second insulative film on said first insulative film.

2. A method as set forth in claim 1, at least one of said first and second insulative films comprising at least one material selected from the group consisting of silicon dioxide, silicon nitride, and alumina.

3. A method as set forth in claim 1, the thickness of said thin metallic film being less than 2000 A.

4. The method of claim 1, said thin metallic film comprising at least one component selected from the group consisting of Be, Al, Cr, Co, Cu, Ge, Au, In, Ir, Fe, Pb, Mn, Mo, Ni, Pd, Pt, Rh, Si, Ag, Ta, Tl, Ti, W, V and Zr.

5. The method of claim 1, said ion beam comprising a constituent of said semiconducting portion of said device.

6. The method as set forth in claim 1, said ion beam comprising ions of an inert gas.

7. The method as set forth in claim 1, said ion beam having energy approximately between 10 and 1,000 keV.

8. The method as set forth in claim 1 the dose of said ion beam being approximately $10^{10}$ to $10^{16}$ cm$^{-2}$.

9. The method of claim 1 comprising adjusting said inversion threshold voltage to a predetermined value by selectively adjusting the thickness of said first and second insulative films and of said thin metallic film, and the type, energy and dose of said ion beam.

10. A method of adjusting in the manufacture of a semiconductor device at least one inversion threshold voltage in the field region of at least one MOSFET of said device, said method comprising the steps of
    forming a field insulative film on the surface of a p-type silicon semiconductive substrate in a field region of each said MOSFET,
    depositing a thin metallic film on the surface of said insulative film,
    bombarding said thin metallic film with at least one ion beam to partially inject said thin metallic film into said field insulative film to change said at least one inversion threshold voltage at at least one corresponding portion of the underlying surface of the substrate, removing said thin metallic film, and depositing a second insulating film on said field insulative film.

11. The method of claim 10 comprising adjusting said at least one inversion threshold voltage to a predetermined value by selectively adjusting the thickness of each said insulative film and of each said thin metallic film and the type, energy and dose of each said ion beam.

12. A method of adjusting the gate inversion threshold voltage of at least one MOSFET in the manufacture of a semiconductor device on a semiconductor substrate, said method comprising the steps of forming a first gate insulative film corresponding to the gate of each said MOSFET on the surface of the semiconductor substrate, depositing a thin metallic film on the surface of said first gate insulative film, bombarding said thin metallic film with at least one ion beam to partially inject said thin metallic film into said first gate insulative film, removing the thin metallic film, depositing a second gate insulative film on said first gate insulative film, and forming a gate electrode for each said MOSFET on the second gate insulative film.

13. A method of providing gates of different threshold voltage for respective MOSFETs during the manufacture of a semiconductor device on a semiconductor substrate, said method comprising the steps of depositing a first gate insulative film to cover the gate regions of said MOSFETs on said semiconductive substrate, depositing on first and second portions of said first gate insulative film first and second thin metallic films, respectively, the first thin metallic film having a thickness different from the second thin metallic film, bombarding said thin metallic films with an ion beam to partially inject each said thin metallic film into the respective portions of said first gate insulative film, removing said thin metallic film, providing a second gate insulative film on each said injected first insulative film, and forming a plurality of gate electrodes for said MOSFETs on said second gate insulative film.

14. The method of claim 13 comprising providing predetermined values for said different threshold voltages by selectively adjusting the thickness of each said gate insulative film and of each said thin metallic film and the type, energy and dose of each said ion beam.

15. A method of providing gates of different threshold voltage in respective MOSFETs during the manufacture of a semiconductor device on a semiconductor substrate, said method comprising the steps of depositing a first gate insulative film covering each region on said one substrate corresponding to the gates of said MOSFETs, depositing on said first gate insulative film at each said region corresponding to said gates a respective one of at least two thin metallic films, at least one of said thin metallic films being of a material different from each other of said thin metallic films, bombarding said thin metallic films with at least one ion beam to partially inject each said thin metallic film into said first gate insulative film, removing said thin metallic films, depositing at least one respective second gate insulative film on said first gate insulative film on said regions corresponding to said gates, and forming a plurality of gate electrodes of said MOSFETs on said gate insulative films.

16. The method of claim 15 comprising providing predetermined values for said different threshold voltages by selectively adjusting the thickness of each said gate insulative film, the type of material and the thicknesses of each said thin metallic film, and the type, energy and dose of each said ion beam.

17. The method of claim 9, 10, 11, 12, 13, or 15, each said thin metallic film being partially injected into said first insulative film to have a surface density of approximately between $10^{10}$ and $10^{16}/cm^2$.

18. The method of claim 9, 10, 11, 12, 13 or 15, comprising forming each said thin metallic layer to have thickness less than approximately 2000 Å.

* * * * *

UNITED STATES PATENT AND TRADEMARK OFFICE
CERTIFICATE OF CORRECTION

PATENT NO. : 4,297,782

DATED : 3 Nov. 1981

INVENTOR(S) : Takashi Ito

It is certified that error appears in the above—identified patent and that said Letters Patent is hereby corrected as shown below:

Front page, [56] Reference Cited, after "McCaldin"
    insert --et al.--; after "Bower" insert --et al--.--
    after "Wakefield" insert --, Jr. et al.--.
        line 62, "herein below" should be --hereinbelow--;
        line 64, after "or" insert --the--; "compli-" should
be --comple---;
        line 66, delete "a".
  Column 2, line 3, "age" should be --ages--;
        line 4, "MIS IC'S" should be --MIS ICs--;
        line 20, ",and;" should be --; and--;
        line 41, "can not" should be --cannot--;
        line 43, after "of" insert --the--;
        line 64, "complimentary" should be --complementary--.
  Column 3, line 8, after "practice" insert --in--;
        line 52, "a" should be --the--.
  Column 4, line 14, after "Au" insert --,--;
        line 14, "manganese" should be --Manganese--;
        line 25, "can not" should be --cannot--;
        line 33, "film,", should be --film--;
        line 34, after "and" delete ";"
  Column 6, line 27, ",and;" should be --;and--.
  Column 7, line 31, "A" should be --$\overset{o}{A}$--;
        line 42, "MIS FET's" should be --MIS FETs--;
        line 45, "p type" should be --p-type--;
        line 48, "Si+" should be --$Si^{+}$--;
        line 50, "cm-2" should be --$cm^{-2}$--.

UNITED STATES PATENT AND TRADEMARK OFFICE
CERTIFICATE OF CORRECTION

PATENT NO. : 4,297,782

Page 2 of 2

DATED : 3 Nov. 1981

INVENTOR(S) : Takashi Ito

It is certified that error appears in the above—identified patent and that said Letters Patent is hereby corrected as shown below:

```
Column 8, line 34, delete ";";
          line 35, after "and" delete ";";
          line 46, delete "of";
          line 48, after "After" delete ",";
          line 50, after "using" change "a" to --the--.
Column 9, line 25, "A" should be --A--;
          line 32, "C.," should be --C,--;
          line 45, "C." should be --C₊--.
          line 46, "n+" should be --n₊--;
          line 52, "n+" should be --n⁺--;
          line 64, "FIG." should be --FIGS.--;
          line 68, "FIG." should be --FIGS.--;
Column 10,line 9, "an" should be --a--;
          line 35, "A" should be --A--;
          line 49, after "1" insert --,--.
In the following places "knock on" should be --knock-on--:
  Column 4, lines 25, 31, 35, 39, 46, 62;
  Column 5, lines 2, 5, 11, 25, 27, 38, 39, 45, 46, 52, 55, 63;
  Column 6, line 50;
  Column 7, lines 26, 57;
  Column 8, lines 18, 66;
  Column 9, line 28.
```

Signed and Sealed this

Ninth Day of November 1982

[SEAL]

Attest:

GERALD J. MOSSINGHOFF

Attesting Officer

Commissioner of Patents and Trademarks